US010340438B2

(12) United States Patent
Rosenblatt et al.

(10) Patent No.: US 10,340,438 B2
(45) Date of Patent: Jul. 2, 2019

(54) LASER ANNEALING QUBITS FOR OPTIMIZED FREQUENCY ALLOCATION

(71) Applicant: International Business Machines Corporation, Armonk, NY (US)

(72) Inventors: Sami Rosenblatt, White Plains, NY (US); Jason S. Orcutt, Katonah, NY (US); Jerry M. Chow, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/823,728

(22) Filed: Nov. 28, 2017

(65) Prior Publication Data

US 2019/0165245 A1 May 30, 2019

(51) Int. Cl.
| | |
|---|---|
| H01L 39/22 | (2006.01) |
| H01L 39/24 | (2006.01) |
| H01L 27/18 | (2006.01) |
| B82Y 10/00 | (2011.01) |
| H01L 39/02 | (2006.01) |
| G06N 10/00 | (2019.01) |

(52) U.S. Cl.
CPC .......... *H01L 39/2493* (2013.01); *B82Y 10/00* (2013.01); *G06N 10/00* (2019.01); *H01L 27/18* (2013.01); *H01L 39/025* (2013.01); *H01L 39/223* (2013.01)

(58) Field of Classification Search
None
See application file for complete search history.

(56) References Cited

U.S. PATENT DOCUMENTS

| | | | |
|---|---|---|---|
| 4,163,156 A | 7/1979 | Daetwyler | |
| 4,220,959 A | 9/1980 | Kroger | |
| 4,490,901 A * | 1/1985 | Clark | H01L 39/2493 257/31 |
| 4,535,219 A | 8/1985 | Sliwa, Jr. | |
| 6,218,214 B1 | 4/2001 | Panchou et al. | |
| 6,232,212 B1 | 5/2001 | Degani et al. | |
| 6,495,915 B1 | 12/2002 | Hsieh et al. | |
| 6,630,723 B2 | 10/2003 | Hedler et al. | |
| 7,002,166 B2 | 2/2006 | Jamieson et al. | |
| 7,122,837 B2 | 10/2006 | Linares et al. | |

(Continued)

FOREIGN PATENT DOCUMENTS

| | | |
|---|---|---|
| DE | 102009033566 A1 | 1/2011 |
| EP | 2202545 A1 | 6/2010 |

(Continued)

OTHER PUBLICATIONS

Rosenblatt et al., "Adjustment of Qubit Frequency Through Annealing", U.S. Appl. No. 15/824,438, filed Nov. 28, 2017.

(Continued)

*Primary Examiner* — Bradley Smith
(74) *Attorney, Agent, or Firm* — Jared L. Montanaro

(57) ABSTRACT

A qubit may be formed by forming a Josephson junction between two capacitive plates. The Josephson junction may be an aluminum/aluminum-oxide/aluminum trilayer Josephson junction on a substrate. The Josephson junction may be annealed with a thermal source. Annealing the Josephson junction may alter the frequency of the qubit.

17 Claims, 7 Drawing Sheets

(56) References Cited

U.S. PATENT DOCUMENTS

| | | | |
|---|---|---|---|
| 7,176,066 | B2 | 2/2007 | Brenner et al. |
| 7,343,059 | B2 | 3/2008 | Beausoleil et al. |
| 7,394,268 | B2 | 7/2008 | Bertin et al. |
| 7,411,187 | B2 | 8/2008 | Monroe et al. |
| 7,466,725 | B2 | 12/2008 | Ichimura et al. |
| 7,679,166 | B2 | 3/2010 | Anderson et al. |
| 7,899,092 | B2 | 3/2011 | Malinovsky |
| 7,977,668 | B2 | 7/2011 | Nevirkovets et al. |
| 8,054,072 | B2 | 11/2011 | Ichimura et al. |
| 8,111,083 | B1 | 2/2012 | Pesetski et al. |
| 8,148,715 | B2 | 4/2012 | Hollenberg et al. |
| 8,329,556 | B2 | 12/2012 | Yuan et al. |
| 8,440,471 | B2 | 5/2013 | Ranjan et al. |
| 8,816,325 | B2 | 8/2014 | Schenkel et al. |
| 9,054,298 | B2 | 6/2015 | Zhou et al. |
| 9,082,637 | B2 | 7/2015 | Taylor |
| 9,208,280 | B2 | 12/2015 | Bocharov et al. |
| 9,350,460 | B2 | 5/2016 | Paik |
| 9,355,362 | B2 | 5/2016 | Shea |
| 9,443,200 | B2 | 9/2016 | Schroff |
| 9,524,470 | B1 | 12/2016 | Chow et al. |
| 9,599,904 | B2 | 3/2017 | Schubert et al. |
| 9,607,271 | B2 | 3/2017 | Papile |
| 9,647,662 | B1 | 5/2017 | Abutaleb et al. |
| 9,858,531 | B1 | 1/2018 | Monroe |
| 10,134,972 | B2 | 11/2018 | Oliver et al. |
| 2002/0074544 | A1 | 6/2002 | Sung et al. |
| 2003/0193097 | A1 | 10/2003 | Il'ichev et al. |
| 2005/0074220 | A1* | 4/2005 | Rey ............ H01L 39/2487 385/141 |
| 2005/0170572 | A1* | 8/2005 | Hongo ........... B23K 26/0738 438/166 |
| 2007/0272669 | A1 | 11/2007 | Comley et al. |
| 2008/0258049 | A1 | 10/2008 | Kuzmich et al. |
| 2009/0057652 | A1 | 3/2009 | Nevirkovets et al. |
| 2013/0119351 | A1* | 5/2013 | Shea ............ H01L 39/223 257/31 |
| 2014/0328116 | A1 | 11/2014 | Guo |
| 2015/0021726 | A1 | 1/2015 | Min et al. |
| 2015/0310350 | A1 | 10/2015 | Niskanen et al. |
| 2015/0316598 | A1 | 11/2015 | Rogge et al. |
| 2016/0292586 | A1 | 10/2016 | Rigetti et al. |
| 2016/0321558 | A1 | 11/2016 | Nakamura et al. |
| 2016/0343934 | A1* | 11/2016 | Chang ............ H01L 39/025 |
| 2016/0344414 | A1 | 11/2016 | Naaman et al. |
| 2017/0001900 | A1 | 1/2017 | Marjanovic et al. |
| 2017/0059964 | A1 | 3/2017 | Nakamura et al. |
| 2017/0072504 | A1 | 3/2017 | Abraham et al. |
| 2017/0076787 | A1 | 3/2017 | Frank |
| 2017/0077382 | A1 | 3/2017 | Abraham et al. |
| 2017/0177534 | A1 | 6/2017 | Mohseni |
| 2018/0012932 | A1 | 1/2018 | Oliver et al. |
| 2018/0102469 | A1 | 4/2018 | Das et al. |
| 2018/0102470 | A1 | 4/2018 | Das et al. |

FOREIGN PATENT DOCUMENTS

| | | |
|---|---|---|
| JP | 3198655 B2 | 8/2001 |
| JP | 2007193778 A | 8/2007 |
| WO | 9822985 A2 | 5/1998 |
| WO | 2017075246 A1 | 5/2017 |
| WO | 2017105524 A1 | 6/2017 |
| WO | 2017131831 A2 | 8/2017 |

OTHER PUBLICATIONS

Rosenblatt et al., "Laser Annealing of Qubits With Structured Illumination", U.S. Appl. No. 15/823,713, filed Nov. 28, 2017.

Hertzberg et al., "Frequency Tuning of Multi-Qubit Systems", U.S. Appl. No. 15/824,492, filed Nov. 28, 2017.

Rosenblatt et al., "Flip Chip Integration on Qubit Chips", U.S. Appl. No. 15/823,675, filed Nov. 28, 2017.

List of IBM Patents or Patent Applications Treated as Related, dated Nov. 27, 2017, 2 pages.

Granata et al., "Trimming of Critical Current in Niobium Josephson Devices by Laser Annealing", 8th European Conference on Applied Superconductivity (EUCAS 2007), Journal of Physics: Conferences Series 97 (2008), Copyright 2008, 6 Pages, IOP Publishing.

Hadden et al., "Waveguide-coupled single NV in diamond enabled by femtosecond laser writing", Apr. 7, 2010, 5 Pages, Institute for Quantum Science and Technology, University of Calgary, Calgary, Canada.

Knoernschild et al., "Independent individual addressing of multiple neutral atom qubits with a micromirror-based beam steering system", Applied Physics Letters 97, Sep. 2010, 3 Pages, Copyright 2010 American Institute of Physics.

Mehta et al., "Integrated Optical Adressing of an ion quibit", Nature Nanotechnology, Dec. 2016, pp. 1066-1070, Copyright 2016 Macmillan Publishers Limited, Department of Electrical Engineering & Computer Science and Research Laboratory of Electronics, Massachusetts Institute of Technology, Cambridge, MA.

Wale, "Self Aligned, Flip Chip Assembly of Photonic Devices with Electrical and Optical Connections", Electronic Components and Technology Conference, 1990, IEEE, 8 pages.

Lee et al., "3D Stacked Flip Chip Packaging with Through Silicon Vias and Copper Plating or Conductive Adhesive Filling", 2005 Electronic Components and Technology Conference, Copyright 2005 IEEE, 7 pages.

Rodin et al., "High Throughput Low CoO Industrial Laser Drilling Tool", Research Gate, Center for Physical Sciences and Technology, Jul. 2008, 7 pages.

Duocastella et al., "Bessel and annual beams for materials processing," Laser Photonics Rev. 6, No. 5, 607-621 (2012), DOI 10.1002/lpor.201100031.

Chen et al. "Qubit architecture with high coherence and fast tunable coupling." Physical review letters 113.22 (2014): 220502, abstract, 5 pgs.

Gilabert et al., "Photoinduced enhancement of the Josephson effect in YBaCuO grain boundary junctions," Journal of Low Temperature Physics, Feb. 1997, vol. 106, Issue 3, pp. 255-264.

Granata et al., "Induced change of critical current density profile in Nb/Al—AlOx/Nb Josephson junctions," Journal of Physics: Conference Series 507 (2014) 042046, 5 pgs.

Granata et al., "Localized laser trimming of critical current in niobium based Josephson devices," App. Phys. Lett. 90, 232503 (2007), doi: 10.1063/1.2746060, 4 pgs.

Granata et al., "Spatial modulation of critical current density in niobium based Josephson junctions induced by selective heating," Appl. Phys. Lett. 102, 222603 (2013); doi: 10.1063/1.4809737, 5 pgs.

Hutchings et al. "Tunable Superconducting Qubits with Flux-Independent Coherence." arXiv preprint arXiv:1702.02253 (2017), pp. 1-17.

Mount et al., "Single qubit manipulation in a microfabricated surface electrode ion trap," New Journal of Physics, vol. 15, Sep. 2013, 17 pgs.

Shim et al., "Bottom-up superconducting and Josephson junction devices inside a Group-IV semiconductor," Nature Communications, 5, 4225 (2014), arXiv:1309.0015v3, 9 pgs.

Saffman, "Quantum Computing with Atomic Qubits and Rydberg Interactions: Progress and Challenges", Journal of Physics B: Atomic, Molecular and Optical Physics, May 17, 2016, 25 Pages, OP Publishing Ltd., Copyright 2016, UK.

Lagoudakis et al., "Initialization of a spin qubit in a site-controlled nanowire quantum dot", New Journal of Physics, 2016, 8 Pages, Published in a partnership with Deutsche Physlakalsche Gesellschaft and the Institute of Physics, IOP Science, Canada.

Rioux et al., "Linear, annular, and radial focusing with axicons and applications to laser machining", Applied Optics, vol. 17, Issue 10, pp. 1532-1536 (1978), https://doi.org/10.1364/AO.17.001532, Abstract Only.

Baek et al. "Thermal stability of Nb/a-NbxSi 1-x/NB Josephson junctions", Physical Review B 75, 054514 pp. 1-6 (2007) (Year: 2007).

(56) References Cited

OTHER PUBLICATIONS

Pavolotsky et al., "Aging- and annealing-induced variations in Nb/Al—AlOx/Nb tunnel junction properties", Journal of Applied Physics 109, 024502 ( 2011) pp. 1-5 (Year: 2011).
Pop et al., "Fabrication of stable and reproducible sub-micron tunnel junctions", arXiv:1105.6204v1 [cond-mat.mes-hall], May 31, 2011 (Year: 2011).
List of IBM Patents or Patent Applications Treated as Related, Oct. 26, 2018, 2 pgs.
Rosenblatt et al., "Laser Annealing of Qubits With Structured Illumination", U.S. Appl. No. 16/183,376, filed Nov. 7, 2018.
List of IBM Patents or Patent Applications Treated as Related, Jan. 17, 2019, 2 pages.
Rosenblatt et al., "Flip Chip Integration on Qubit Chips," U.S. Appl. No. 16/251,569, filed Jan. 18, 2019.
Notification of Transmittal of The International Search Report and The Written Opinion of The International Searching Authority, or The Declaration, dated Jan. 30, 2019, International application No. PCT/EP2018/080735, 16 pages.
Braslau et al, "Fabrication of Planar Josephson Junctions by Laser Irradiation", An IP.com Prior Art Database Technical Disclosure, Original Publication Date: Apr. 1, 1976, IP.com No. IPCOM000085574D, IP.com Electronic Publication Date: Mar. 2, 2005, 2 pages.
International Search Report and Written Opinion, International Application Number PCT/EP2018/080736, 10 pgs., Mar. 6, 2019.

\* cited by examiner

LASER ANNEALING QUBITS FOR OPTIMIZED FREQUENCY ALLOCATION

BACKGROUND

The present disclosure relates generally to the field of qubit manufacturing for quantum computing, and more specifically to programming the frequency of a qubit post fabrication.

In quantum computing, a qubit or quantum bit is a unit of quantum information—the quantum analogue of the classical bit. A qubit is a two-state quantum-mechanical system. In a classical system, a bit would have to be in one state or the other. However, quantum mechanics allows the qubit to be in a superposition of both states at the same time, a property that is fundamental to quantum computing.

SUMMARY

Embodiments of the present disclosure include a method for forming a qubit. A qubit may be formed by forming a Josephson junction between two capacitive plates. The Josephson junction may be an aluminum/aluminum-oxide/aluminum trilayer Josephson junction on a substrate. The Josephson junction may be annealed with a thermal source. Annealing the Josephson junction may alter the frequency of the qubit.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
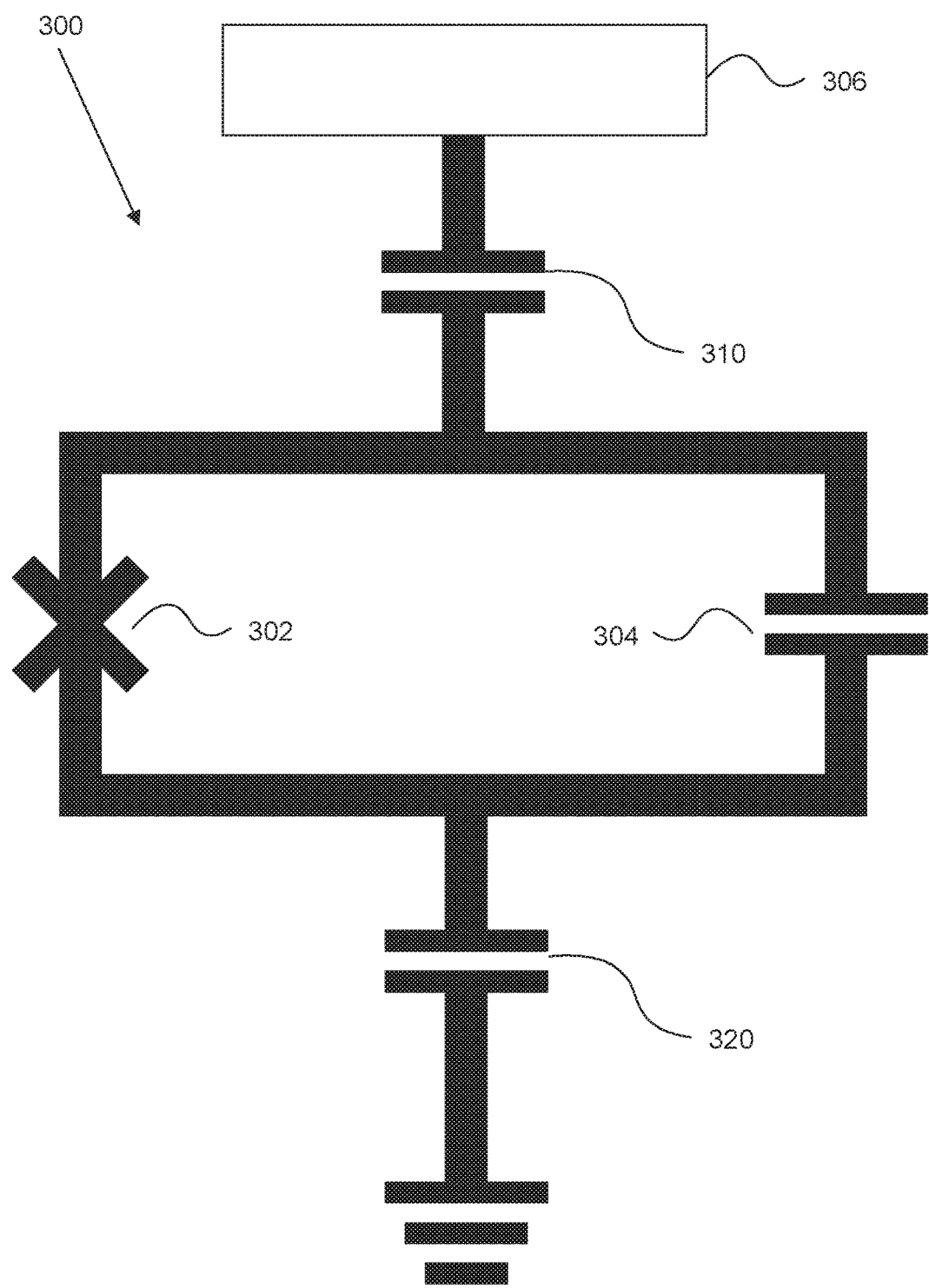
FIG. 1 depicts a qubit containing a Josephson junction and a capacitor connected in parallel, in accordance with embodiments of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Aspects of the present disclosure relate generally to the field of qubit manufacturing for quantum computing, and more specifically to allocating a design frequency to a qubit following formation of the Josephson junction. While the present disclosure is not necessarily limited to such applications, various aspects of the disclosure may be appreciated through a discussion of various examples using this context.

In some embodiments, a qubit may be formed by a Josephson junction between two capacitive plates. In some embodiments, the qubit may be annealed. In some embodiments, annealing the qubit may include aligning a thermal source with a location of the Josephson junction (e.g., the Josephson junction may be located by microscopy or any other location means) and applying the thermal source to the location of the Josephson junction. In some embodiments, the qubit may be cooled. In some embodiments, cooling the qubit may include removing the thermal source from the location of the Josephson junction. In some embodiments, the qubit may be a transmon qubit that is designed to have reduced sensitivity to charge noise.

In some embodiments, the Josephson junction may be an aluminum/aluminum-oxide/aluminum trilayer Josephson junction on a substrate. The substrate may be Silicon, sapphire, and/or magnesium oxide (MgO). For example, the Josephson junction may be comprised of superconducting upper and lower layers of aluminum and an inner contact of aluminum-oxide may connect the upper and lower layers. Current may then be able to travel through the aluminum-oxide as though it were a superconductive material. That is, the aluminum/aluminum-oxide/aluminum trilayer may be superconducting at a superconducting critical temperature of 1.2 kelvin. In some embodiments, each aluminum layer of the aluminum/aluminum-oxide/aluminum trilayer may be connected to a respective niobium capacitive plate (e.g., niobium/aluminum/aluminum-oxide/aluminum/niobium).

In some embodiments, the thermal source may be a laser that produces (e.g., generates, yields, creates) a beam (e.g., laser beam). In some embodiments, the beam may have a wavelength of 532 nm. In some embodiments, the beam may heat the Silicon (or, in other embodiments, sapphire or MgO) substrate. The beam may additionally heat the aluminum portions of the aluminum/aluminum-oxide/aluminum trilayer Josephson junction. The beam may further heat the aluminum-oxide portion of the aluminum/aluminum-oxide/aluminum trilayer Josephson junction. That is, the beam may first be absorbed by the Silicon substrate, which converts the beam into heat, and, in turn, heat anneals the Josephson junction.

In some embodiments, applying the thermal source to the Josephson junction may uniformly increase the temperature of the Josephson junction. In some embodiments, uniformly increasing the temperature of the Josephson junction may include applying the thermal source to the Josephson junction as a function of time and a power level of the thermal source (e.g., for 1 minute at a low power level).

For example, a low power laser beam with a 532 nm wavelength may be directed toward and directly applied to (e.g., positioned on) a Josephson junction (e.g., including each of the aluminum/aluminum-oxide/aluminum portions that compose the Josephson junction) for 1 second. The application of the low power level laser beam for the 1 second duration may increase the resistance of the Josephson junction (e.g., at a low power level, the laser may supply enough thermal energy to increase resistance in the Josephson junction). The increased resistance may allow the qubit associated with the Josephson junction to decrease in frequency.

In some embodiments, the laser may have four power settings, with the first two power settings being considered "low power," the third power setting being considered a "middle power," and the fourth power setting being considered a "high power." At the low power settings and having the beam generated by the laser anneal the Josephson junction for 20 seconds, it may be seen that resistance of a Josephson junction may increase from a range of 2% to 100%. Additionally, the frequency of a qubit may be seen to decrease by 0.5% to 1.5% during the duration of the beam annealing a Josephson junction contained within the qubit while at the low power settings. The resistance change of the Josephson junction and frequency change of the qubit may remain after beam is removed from the Josephson junction.

At the middle power setting and having the beam generated by the laser anneal the Josephson junction for 20 seconds, it may be seen that resistance of a Josephson junction may increase from a range of 13% to 4%. The highest increase of resistance change (13%) may be seen during the Josephson junction initially being exposed to the beam (e.g., 1 second to 5 seconds). The lowest increase of resistance change (4%) may be seen during the Josephson junction's extended exposure by the beam (e.g., 15 seconds to 20 seconds). That is, the resistance initially increases quickly after being exposed to the beam at the middle power setting for the first five seconds, and then slowly increases in resistance for the duration of exposure to the beam. Additionally, the frequency of a qubit may be seen to decrease between 1.5% and 2.5% while applying the beam at the middle power setting to a Josephson junction contained within the qubit. The resistance change of the Josephson junction and frequency change of the qubit may remain after beam is removed from the Josephson junction.

Annealing the Josephson junction with the beam at the high-power setting for 20 seconds, it may be seen that resistance of a Josephson junction may decrease from a range of 2% to 12%. The lowest decrease of resistance change (1%) may be seen during the Josephson junction initially being exposed to the beam (e.g., 1 second to 5 seconds). The highest decrease of resistance change (7%) may be seen during the Josephson junction's extended exposure to the beam (e.g., 15 seconds to 20 seconds). That is, the resistance initially decreases slowly after being exposed to the beam at the high-power setting for the first five seconds, and then quickly decreases in resistance for the duration of exposure to the beam. Additionally, the frequency of a qubit may be seen to increase from a range of 1% to 6% during the duration of the beam annealing a Josephson junction contained within the qubit while at the high-power setting (e.g., the frequency of the qubit may have an opposite sign change at the high-power setting). The resistance change of the Josephson junction and frequency change of the qubit may remain after beam is removed from the Josephson junction.

In some embodiments, when applying the thermal source to the Josephson junction, a first frequency of the qubit may increase or decrease to a second frequency. For example, a beam may be directed toward a Josephson junction and the resistance across the Josephson junction may increase. The increase in resistance may cause the qubit associated with the Josephson junction to decrease in frequency, as the resistance of the Josephson junction and the frequency of the qubit have an inverse relationship.

In some embodiments, a qubit may comprise a capacitor and a Josephson junction. In some embodiments, the qubit may comprise any combination or number of a Josephson junction and any other components used in fabricating a Josephson junction (such as a capacitor). These techniques may allow for the fabrication of qubits without flux lines by allowing for tuning of the frequency of the qubit without magnetic flux, however such techniques may be used in combination with flux lines or other similar components.

In some embodiments, the Josephson junction may transition (i.e., the resistance may be altered) from a first resistance to a second resistance when a thermal source is applied to the Josephson junction. In various embodiments, the second resistance may be greater than or less than the first resistance. In some embodiments, when the Josephson junction transitions to the second resistance, the qubit may transition to a second frequency. In various embodiments, the second frequency may be greater than or less than the first frequency.

For example, a laser beam may be applied to the Josephson junction, which may anneal the Josephson junction. The first resistance of the Josephson junction may then transition to a second resistance greater than the original. The transition to the second resistance greater than the first resistance may cause the qubit to transition to a second frequency less than its first (e.g., original) frequency.

In some embodiments, the Josephson junction may transition to a second resistance when heated by a thermal source. In some embodiments, the second resistance may be less than the first resistance. In some embodiments, when the Josephson junction transitions to the second resistance, the qubit may transition to a second frequency. In some embodiments, the second frequency may be greater than the first frequency.

In some embodiments, the thermal source may be a laser that generates a beam. In some embodiments, the beam may be monochromatic and have a wavelength of 532 nm. In some embodiments, the beam may be a Gaussian beam, which may be completely illuminated (e.g., the beam may include a monochromatic, illuminated center with a monochromatic, illuminated circumference). In some embodiments, the beam may have a 514 nm wavelength. It is noted, however, that any light source with energy above the Silicon substrate bandgap can in principle be used as long as the heat absorbed by the Silicon substrate is sufficient to anneal the junction. In some embodiments, the beam may have a diameter that is greater than a diameter of the Josephson junction. In some embodiments, a polarizing beam splitter may separate the beam into a first half that is directed in a first beam path and a second half that is directed in a second beam path. In some embodiments, the first beam path may focus the beam on an image sensor (e.g., in an imaging path, which is further discussed in FIG. 6) and the second laser path may focus the beam on the Josephson junction (e.g., in an annealing path, which is further discussed in connection with FIG. 6).

For example, a laser may be directly aligned with a Josephson junction and in the alignment path between the laser and the Josephson junction there may be a polarizing beam splitter. Additionally, a beam intensity sensor (e.g., a power meter) may be placed outside of the alignment path between the laser and the Josephson junction. Alternatively, the beam intensity sensor may be placed inside the alignment path between the laser and the Josephson junction on demand and not simultaneously to annealing (e.g., the power meter may move in and out of the path with an actuator to test the intensity of the beam). The laser may be turned on and the polarizing beam splitter may be exposed to the beam produced by the laser, splitting the beam into a first portion and a second portion. The first portion of the beam may continue in the alignment path and be directly applied to the Josephson junction. The second portion of the beam, as directed by the polarizing beam splitter and an adjacent non-polarizing beam splitter, may be directed by a tube lens into an image sensor. Additionally, a narrow bandwidth monochromatic source illuminates the non-polarizing beam splitter, and its illumination is also split into two portions. The first portion of the illumination is blocked and the second portion is directed by the adjacent polarizing beam splitter to the sample. The reflection of the second portion of the illumination is directed by the polarizing beam splitter, the adjacent non-polarizing beam splitter, and the tube lens to the image sensor. In some embodiments, the image sensor may be a camera.

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refers to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

Referring now to FIG. 1, illustrated an example qubit 300, in accordance with one embodiment of the present disclosure. In some embodiments, the qubit 300 contains a Josephson junction 302, and a capacitor 304 connected in parallel with one another as shown in FIG. 1. The parallel Josephson junction 302 and capacitor 304 arrangement is capacitively coupled by a coupling capacitor 310 to structure 306, as well as capacitively coupled by a coupling capacitor 320 to ground. While only a single structure is shown capacitively coupled to the Josephson junction 302 and capacitor 304, multiple structures may be attached to the parallel Josephson junction 302 and capacitor 304 arrangement depicted. For example, a readout structure and interconnects to other qubit structure may each be capacitively connected to the parallel Josephson junction 302 and capacitor 304 arrangement. Additionally, while qubit 300 is depicted as using coupling capacitor 310 and coupling capacitor 320, other methods of electrically connecting the qubit may be used. In accordance with one example embodiment, the capacitor 304 is in the range of 0.1 femtofarads (fF) to 200 femtofarads (fF). In accordance with one example embodiment, the Josephson junction 302 has an effective critical current ranging approximately from 10 to 100 nanoamperes. The critical current is related to the overall resistance of the Josephson junction, prior to achieving a superconducting state through the Ambegaokar-Baratoff relation. More specifically, the relation predicts that the resistance of the Josephson junction prior to achieving the superconducting state is inversely proportional to the critical current after turning superconducting. Furthermore, this critical current is also inversely proportional to the inductance of the Josephson junction.

As a result, the resonance frequencies of the qubit range approximately between a few hundred MHz up to about 20 GHz. The coupling capacitor 310 of the qubit can be engineered for high fidelity read-out. The qubit described in this example embodiment is also known as a single-junction transmon qubit. Such a qubit is not susceptible to tuning using a magnetic field and its resonance frequency is therefore fixed by the parameters of capacitor and junction formed at the time of fabrication. In other embodiments, any type of qubit may be discussed (e.g., a phase qubit, charge qubit). In such other embodiments, two or more Josephson junctions arranged as series or parallel circuit elements may substitute for the single Josephson junction 302 depicted in FIG. 1.

Figure 2:
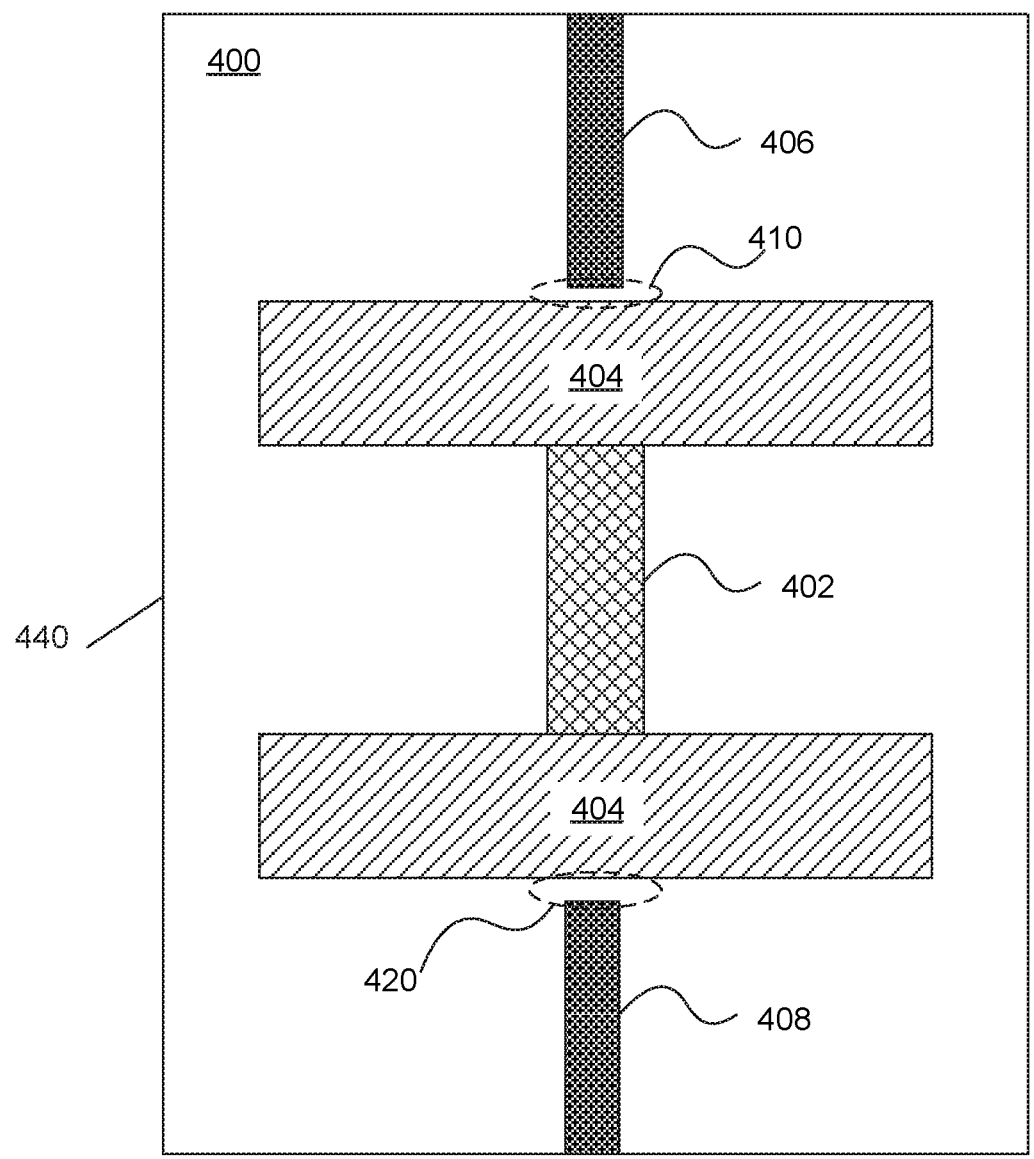
FIG. 2 depicts a top view of a substrate for fabrication of a Josephson junction, in accordance with embodiments of the present invention.

Referring now to FIG. 2, illustrated is an example layout of an embodiment of the capacitively coupled qubit depicted in FIG. 1 following fabrication on substrate 400, in accordance with embodiments of the present disclosure fabrication of the Josephson junction 402 may proceed by any of a number of processes. Two examples are (1) subtractive patterning of a trilayer (superconductor(s)-insulator-superconductor(s)) material stack or (2) the Dolan bridge process. The Dolan Bridge technique is described herein as an illustrative example. In such processes, the Josephson junction 402 is patterned between capacitive plates 404, which may be capacitively coupled, via capacitor 410, to line 406, and capacitively coupled to ground line 408, via capacitor 420, all located on substrate 400. While only a single line 406 is depicted, multiple lines may be arranged about capacitive plates 404, thus capacitively connecting qubit 440 to a plurality of structures. Such arrangements and geometries may be a matter of design choice or modeling.

In the example embodiment, the substrate 400 on which the qubit circuit is formed can be high resistivity (intrinsic) eight-inch Silicon wafers. A bilayer of resist is spun on the wafers, which consists of a copolymer methyl methacrylate (MMA) layer and a subsequent thinner layer of polymethyl methacrylate (PMMA). Using electron-beam lithography, a pattern for the Josephson junction 402 is written into the resist. This step is followed by development in an MIBK: IPA (Methyl Isobutyl Ketone (MIBK) Isopropyl alcohol (IPA)) (1:3) solution for about one minute, which eats away all the areas exposed to the electron beam. The MMA layer is more sensitive to the electron beam, which creates areas of undercut PMMA. As such, a suspended bridge out of the PMMA, also called a Dolan bridge, can be made with no MMA beneath. The sample is placed in an e-beam evaporator where Al is evaporated at two angles with oxidation (in an $Ar/O_2$ atmosphere) between Al evaporations. The junction is formed in the overlap area. The remaining resist and unwanted metal is removed by placing the sample in acetone. Using this lift-off technique, junction areas can be made ranging from 0.01 $\mu m^2$ to 1 $\mu m^2$. This basic fabrication process can be used with other extra fabrication steps such as PECVD, optical lithography, and RIE to make more complicated devices.

In example embodiments, the Josephson junction 402 is fabricated on a Silicon (Si) substrate using aluminum as a starting compound to form an Al/AlOx/Al structure. In an example embodiment, the substrate 400 is selected to reduce dielectric loss tangent at low temperatures. The substrate 400 may also be selected to be a material, which can be etched selectively to the superconducting and dielectric material to be used for the Josephson junction 402. For example, high resistivity Si wafers may be implemented.

In the example embodiment, capacitive plates 404 may be suitable superconducting compounds such as, for example, Nb, NbN, NbCN, NbTiN, and Pb. In an example embodiment, capacitive plates 404 may be about 1 to 100 micrometers apart. In an example embodiment, capacitive plates 404 may have a width of about 5 to about 500 micrometers (e.g., the dimension substantially parallel to the Josephson junction 402 in FIG. 2), a length of about 1 to about 200 micrometers (e.g., the dimension substantially parallel to the Josephson junction 402 in FIG. 2), and a height of about 10 to about 500 nanometers off the surface of substrate 400.

Figure 3A:
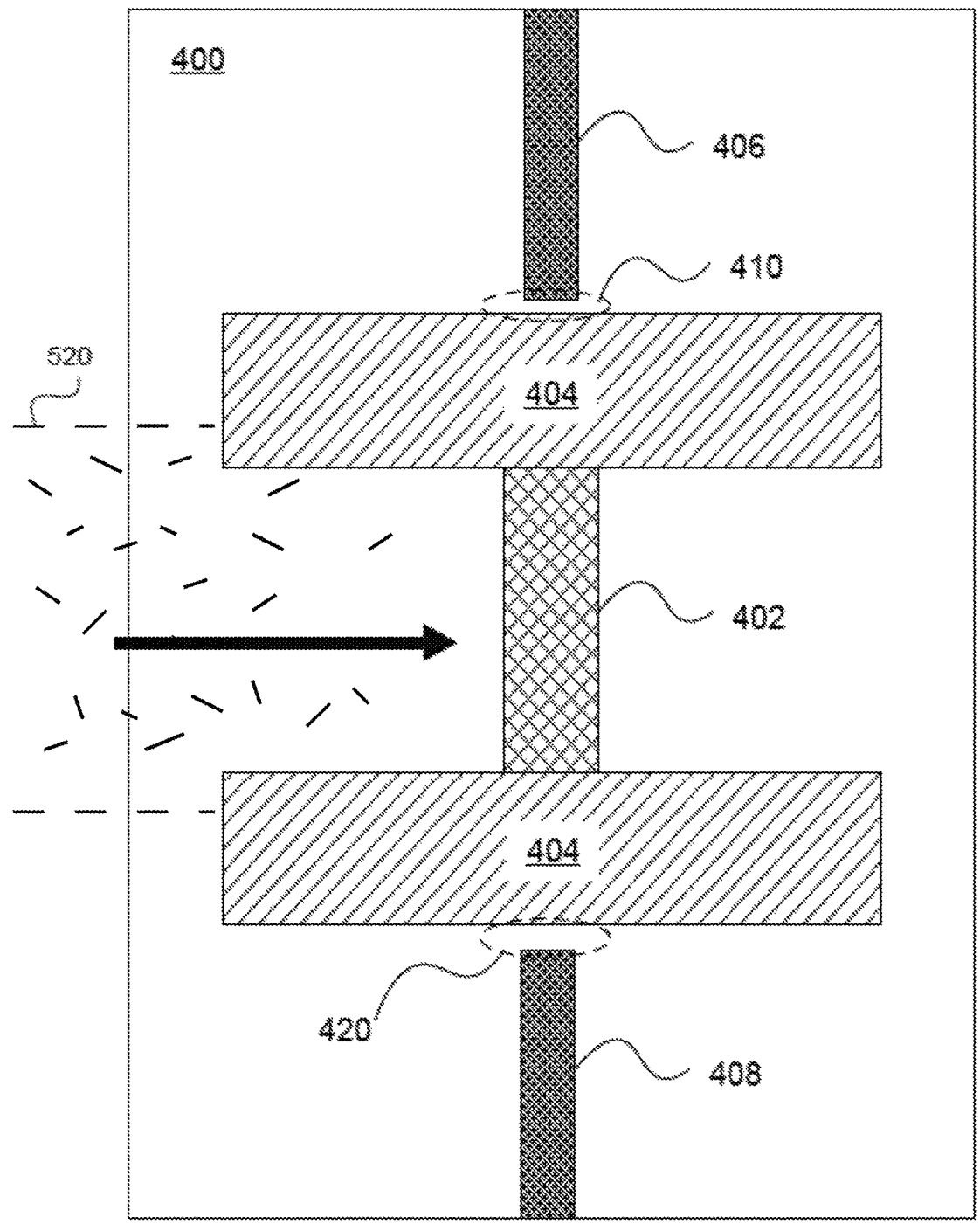
FIG. 3A depicts a top view of an example qubit undergoing a laser anneal, in accordance with embodiments of the present invention.

Referring to FIG. 3A, the qubit 500 may be annealed to adjust the resistance of the Josephson junction 402 in order to adjust the frequency of the qubit. Annealing of the Josephson junction 402 may include heating the Josephson junction 402 to allow for a physical change to occur within the Josephson junction 402 that results in a change in the resistance. In annealing of the Josephson junction 402, annealing below a threshold dose may result in an increase in the resistance of the Josephson junction 402, while annealing above that threshold may decrease the resistance of the Josephson junction 402. In an embodiment, annealing of the Josephson junction 402 may be done by laser annealing, via thermal source 520, which may enable localized heating to the Josephson junction 402. In an example embodiment, laser annealing may be performed using a doubled Nd:YAG source, emitting a laser having a 532 nm wavelength. However, various other wavelengths of light may be used or tested to determine an optimal path to shift the frequency of the qubit. In the example embodiment, a threshold dose may be about 1.4 W for 10 seconds. Thus, in the example embodiment, annealing the Josephson junction 402 at doses below 1.4 W for 10 seconds would lead to an increase in resistance, while annealing at doses above 1.4 W for 10 seconds would lead to a decrease in resistance. Based on methods of the embodiment, power, light frequency and duration of the anneal may be tested to determine and adjusted to achieve the proper frequency shift for a given set of conditions.

Figure 3B:
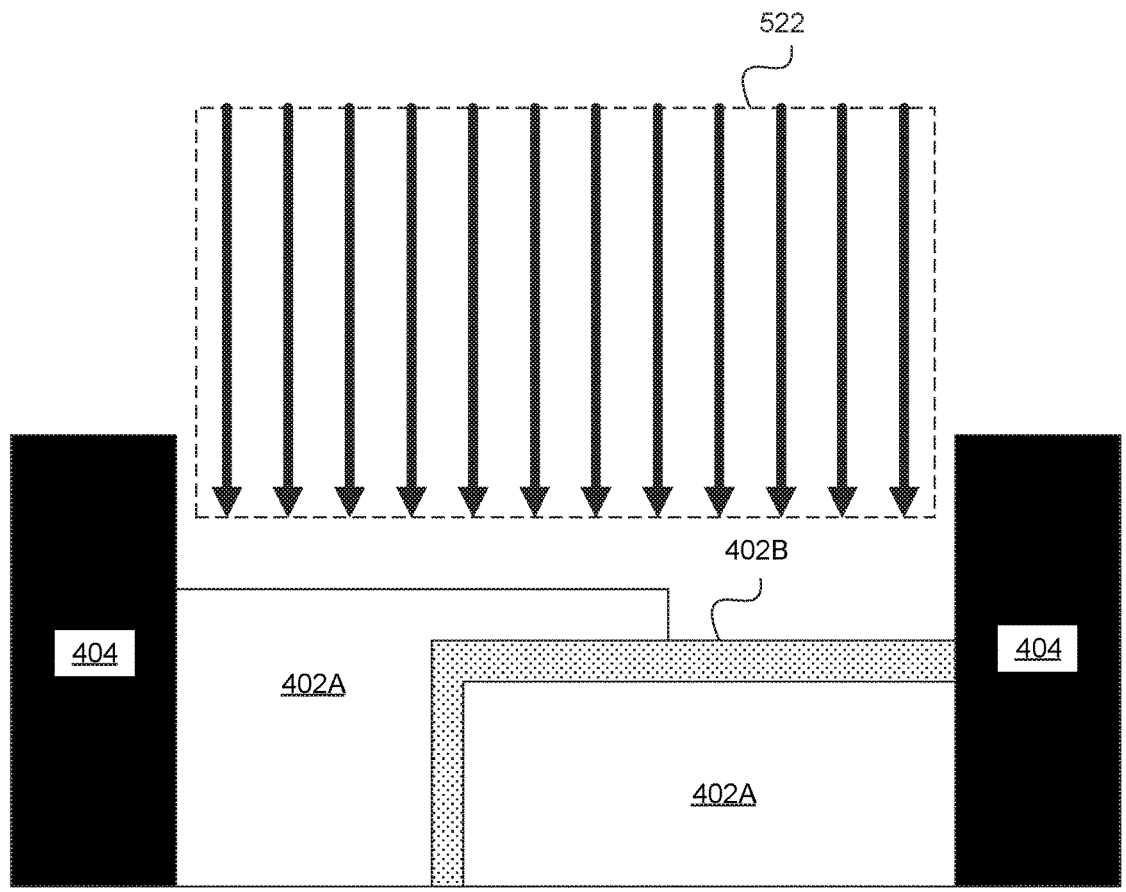
FIG. 3B depicts a cross-sectional view of an example qubit undergoing a laser anneal, in accordance with embodiments of the present disclosure.

Referring to FIG. 3B, an annealing pattern 522 of laser annealing Josephson junction 402 is depicted. FIG. 3B depicts a cross-sectional view of FIG. 3A, where Josephson junction 402 is depicted as its constituent layers, aluminum layers 402A and aluminum oxide layer 402B. In such embodiments, aluminum oxide layer 402B may be between 0.1 and 10 nm thick, which may allow quantum tunneling to occur between aluminum layers 402A. As should be understood, the arrangement depicted in FIG. 3B is an example arrangement of the Josephson junction 402, and other geometries may be used.

Still referring to FIG. 3B, annealing pattern 522 may be any pattern capable of changing the resistance of the Josephson junction 402 (FIG. 3A). In an example embodiment, the annealing pattern 522 may cover the entirety of aluminum layers 402A, as well as aluminum oxide layer 402B. In an example embodiment, the annealing pattern 522 may be focused such that it does not hit capacitive plates 404, and thus only annealing of the Josephson junction 402 occurs. The anneal may be performed using a beam focused only on Josephson junction 402, without contact onto capacitive plates 404, thereby causing uniform heating of the Josephson junction 402.

In some embodiments, the annealing pattern 522 may be less than or equal to 10 microns, which may be the size of the beam spot of the thermal source 520 being applied to the Josephson junction 402 (e.g., a laser beam may have a 10-micron diameter). The annealing pattern 522 may be applied with a thermal source 520 in order to decrease or increase the resistance of the Josephson junction 402, which may increase or decrease the frequency of a qubit associated with the Josephson junction 402. In some embodiments, the resistance of the Josephson junction 402 and the frequency of the qubit may have an inverse relationship (e.g., if the resistance of the Josephson junction 402 increases, the frequency of the qubit may decrease, or vice-versa, as long as the capacitance of the qubit is unaffected).

For example, a laser beam may be applied to the Josephson junction 402, which may have a first resistance of 10 kOhms. The thermal source above the threshold dose may be applied to Josephson junction 402 for 1 minute, decreasing the resistance of the Josephson junction 402 to the second resistance of the Josephson junction 402, which may be 9.9 kOhms.

Figure 4:
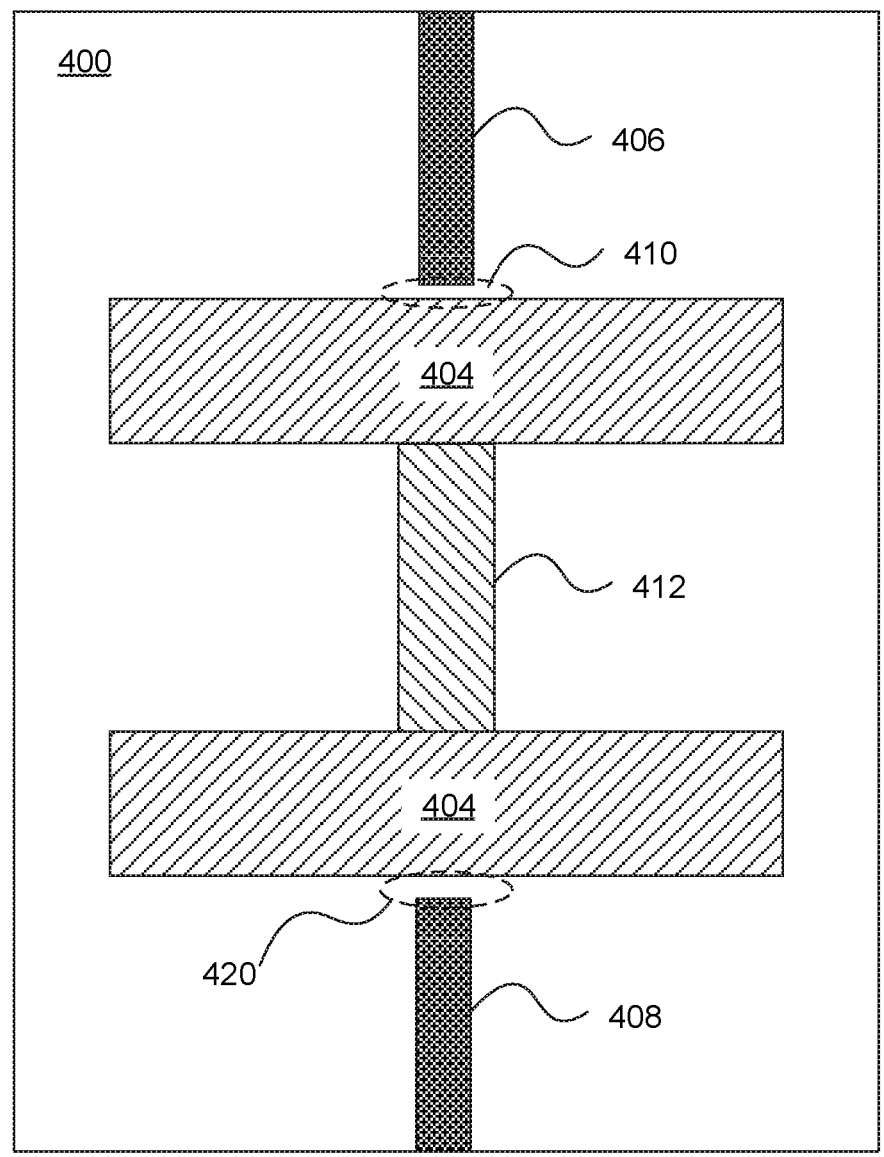
FIG. 4 depicts a top view of an example qubit after a laser anneal, in accordance with embodiments of the present disclosure.

Referring to FIG. 4, following removal of the thermal source 520, a Josephson junction 412 may result having a different resistance from Josephson junction 402 prior to application of the thermal source 520. In some embodiments, the Josephson junction 412 may be at the second resistance until reapplication of the thermal source 520. The second resistance may differ from the original resistance of Josephson junction 402 based on the time, intensity and frequency of the thermal source 520.

Figure 5:
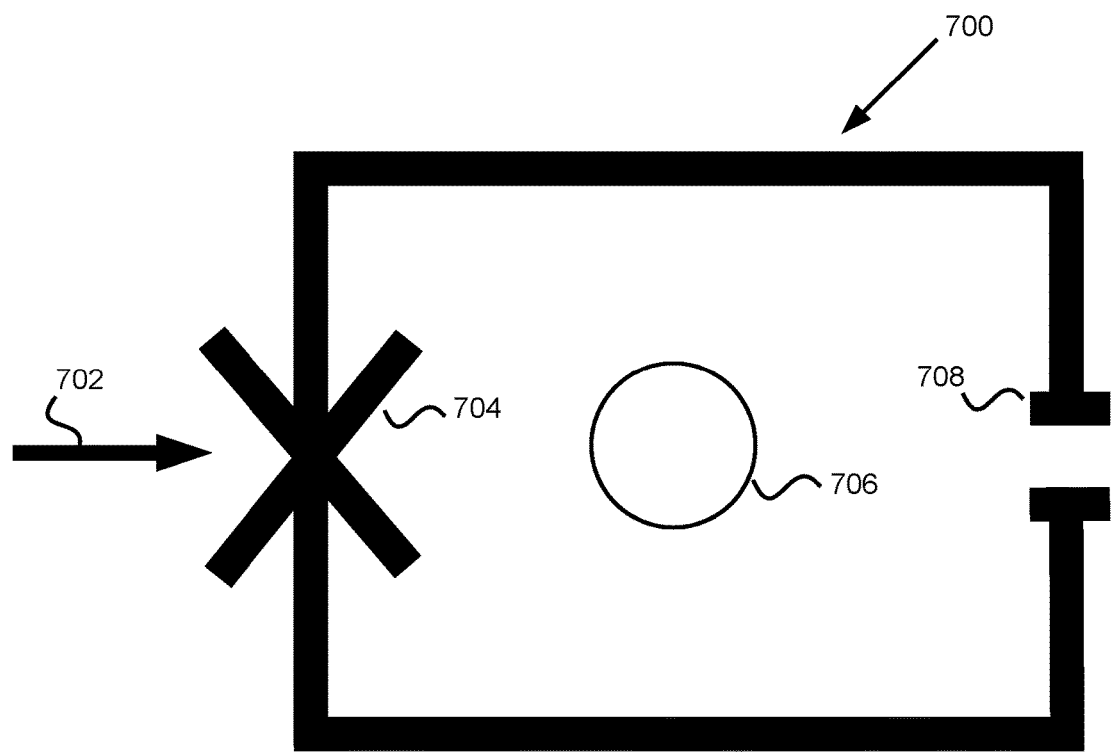
FIG. 5 illustrates an example method for setting a frequency of a qubit, in accordance with embodiments of the present disclosure.

Referring now to FIG. 5, an example anneal operation 700 for setting a frequency of a qubit is depicted, in accordance with embodiments of the present disclosure. In some embodiments, a qubit 706 may comprise a Josephson junction 704 and a capacitor 708 connected in parallel with one another (e.g., as shown in FIG. 3A). In some embodiments, the qubit 706 may be formed by forming the Josephson junction 704 between two capacitive plates.

In some embodiments, during the anneal operation 700, the Josephson junction 704 may be annealed by a thermal source 702. In some embodiments, the thermal source 702 may be directly applied to the Josephson junction 704. In some embodiments, when annealing the Josephson junction 704 with the thermal source 702, the resistance of the Josephson junction 704 may decrease and the frequency of the qubit 706 may increase. In some embodiments, the resistance of the Josephson junction 704 may increase and the frequency of the qubit 706 may decrease.

For example, a laser beam may be applied to a Josephson junction associated with a qubit, wherein the qubit has a frequency of 5 GHz. The laser beam may be applied to the Josephson junction until the frequency of the qubit becomes 5.05 GHz, the laser beam may be turned off and the Josephson junction may be allowed to cool, maintaining the qubit at 5.05 GHz. It may then be determined by a user or a system evaluating the frequency of the qubit, that the new qubit frequency of 5.05 GHz is too high for present quantum applications. The laser beam may then be reapplied to the Josephson junction at a lower power, and the frequency of the qubit may be lowered to 4.95 GHz. The laser beam may then be removed and the Josephson junction cooled, leaving the qubit at the newest frequency of 4.95 GHz. The newest frequency of the qubit at 4.95 GHz may be determined to be applicable to the present quantum application and the qubit may be left at the frequency of 4.95 GHz.

Figure 6:
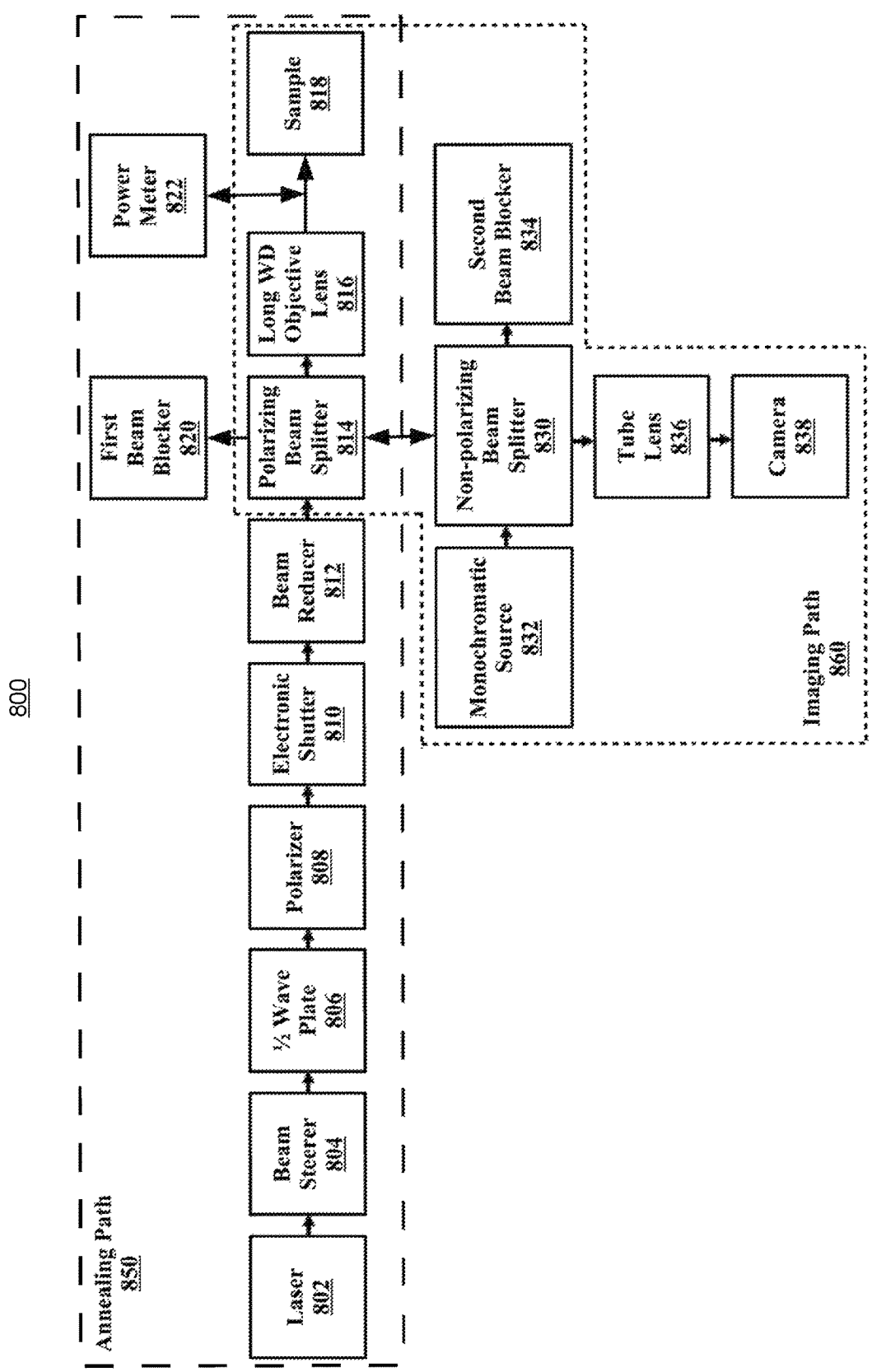
FIG. 6 illustrates an example system for applying a laser to a Josephson junction, in accordance with embodiments of the present disclosure.

Referring now to FIG. 6, illustrated is an example system 800 for applying a thermal source to a Josephson junction, in accordance with embodiments of the present disclosure. In some embodiments, the system 800 may include an annealing path 850 and an imaging path 860. In some embodiments, the annealing path 850 may include a laser 802, a beam steerer 804, a half-wave plate 806, a polarizer 808, an electronic shutter 810, a beam reducer 812, a polarizing beam splitter 814, a long working-distance (WD) objective lens 816, a sample 818, a first beam blocker 820, and a power meter 822. In some embodiments, the imaging path 860 may include the polarizing beam splitter 814, the long WD objective lens 816, the sample 818, a monochromatic source 832, a non-polarizing beam splitter 830, a second beam blocker 834, a tube lens 836, and a camera 838.

In some embodiments, the laser 802 may be aligned in the annealing path 850 with the sample 818. In some embodiments, the laser 802 may be turned on and the beam steerer 804 may be exposed to the generated beam. The beam steerer 804 may change the angle and/or alignment of the beam. In some embodiments, the beam steerer 804 may be one or more mirrors. In some embodiments, the beam may continue from the beam steerer 804, and the half-wave plate 806 may be exposed to the it. The half-wave plate 806 may shift the polarization direction of the beam. In some embodiments, the half-wave plate 806 may have an adjustable (e.g., electronically-controlled) rotation in order to adjust the total attenuation (e.g., by rotating the polarization incident on the polarizer 808) to the desired power level (e.g., the electronically-controlled adjustment).

The beam may continue on the annealing path 850, from the half-wave plate 806, and the polarizer 808 may be exposed to it. In some embodiments, the polarizer 808 may be an optical filter that allows a specific polarization of light waves associated with the beam to pass through the optical filter and blocks light waves of other polarizations. In some embodiments, the polarizer 808 may convert undefined or mixed polarization of light waves associated with the beam into a beam of well-defined, polarized light.

In some embodiments, the beam may continue on the annealing path 850 and the electronic shutter 810 may be exposed to it. In some embodiments, the electronic shutter 810 may control a pulse of the beam. For example, the electronic shutter 810 may open in order to apply the beam to the sample 818 for 1 minute. The electronic shutter 810 may automatically close after the 1 minute in order to remove the beam from the sample 818.

In some embodiments, the beam may continue on the annealing path 850 and the beam reducer 812 may be exposed to it (e.g., to apply heat/anneal the sample). In some embodiments, beam reducer 812 may reduce the size of the beam by a factor of 5. The reduction of the beam size by 5 may increase the intensity (e.g., optical intensity or light intensity) of the beam. In some embodiments, intensity may be power per unit area (e.g., the beam is concentrating more power in a smaller area, such as, the specific Josephson junction). In some embodiments, the beam reducer 812 may be used to adjust the size of the beam and to adjust the field of view of the camera 838. For example, the beam is first reduced from a 2 mm width by a factor of approximately five down to approximately 400 microns width with the beam reducer 812, then the long WD objective lens 816 further reduces the beam down to 10 microns. In some embodiments, the beam may continue on the annealing path 850, from the beam reducer 812, and the polarizing beam splitter 814 may be exposed to it. Upon the polarizing beam splitter 814 being exposed to the beam, the beam may split into a first portion and a second portion.

In some embodiments, the first portion and the second portion of the laser beam may each retain some of the original physical properties of the beam before being split by the polarizing beam splitter 814 (e.g., each of the portions may have a width and a wavelength equal to a width and a wavelength of each other portion and equal to a width and a wavelength of the beam before splitting). For example, if the beam has a 532 nm wavelength, each of the portions will have the same 532 nm wavelength. Or, if the beam has a 10-micron diameter, each of the portions will have the same 10-micron diameter.

In some embodiments, the first portion of the beam, from the polarizing beam splitter 814, the beam blocker 820 may be exposed to it, and the long WD objective lens 816 may be exposed to the second portion of the beam. It is noted that any of the first beam blocker 820, the non-polarizing beam splitter 830, and the long WD objective lens 816 may be exposed to any of the portions of the beam (e.g., the long WD objective lens 816 may be exposed to the first portion of the beam).

In some embodiments, when the first beam blocker 820 is exposed to the first portion of the beam, the first portion of the beam may cease traveling on the annealing path 850. The first beam blocker 820 (and subsequently the second beam blocker 834) may be an optional component to serve a safety function (e.g., so that a person and/or sensitive object does not get exposed to the beam). In some embodiments, the long WD objective lens 816 may have a 10 mm focal length and focus the second portion of the beam. The second portion of the beam may continue to travel on the annealing path 850, from the long WD objective lens, to the sample 818. The second portion of the beam may directly illuminate and/or heat the sample 818. The direct illumination may anneal the sample 818. In some embodiments, the second portion of the beam may have its power level measured by the power meter 822 while traveling from the long WD objective lens 816 to the sample 818. The power meter 822 may regularly and automatically collect power readings for the second portion of the beam (e.g., the beam). In some embodiments, the power meter 822 may sit on a rail (not shown) controlled by an actuator. The power meter 822 may slide in and out (not shown) on demand for a direct power readout.

In some embodiments, the second portion of the beam may be reflected back from the sample into the polarizing beam splitter as a reflected second portion of the beam which coexists with the second portion of the beam but propagates in the opposite direction. In some embodiments, upon the polarizing beam splitter 814 being exposed to the reflected second portion of the beam, it may split into a third beam portion and a fourth beam portion. In some embodiments, the non-polarizing beam splitter 830, which is necessary for imaging, may be exposed to the third portion of the beam. In some embodiments, the fourth portion of the beam may propagate toward the laser 802.

In some embodiments, the non-polarizing beam splitter 830 may be exposed to the third portion of the beam, and it may be split into a fifth portion and a sixth portion of the beam. Again noted, is that the fifth and sixth portions of the beam may each retain some of the original physical properties of the beam before being split by the non-polarizing beam splitter 830. Additionally, any of the components described below may be exposed to any of the portions of the beam.

In some embodiments, the non-polarizing beam splitter 830 may additionally be exposed to monochromatic light emanating from the monochromatic source 832. The monochromatic source 832 may produce light having a 50 nm bandwidth. The non-polarizing beam splitter 830 may split the monochromatic light into a first and second portion of light. It is noted that the first and second portions of monochromatic light may each retain some of the physical properties (e.g., the color of light) of the monochromatic light before being split by the non-polarizing beam splitter 830. Additionally, any of the components described below may be exposed to any of the portions of the monochromatic light.

The non-polarizing beam splitter 830 may split monochromatic light from the monochromatic source 832 and the third portion of the beam independent of the light and the beam's polarization. In some embodiments, the second beam blocker 834 may be exposed to the first portion of light from the monochromatic source 832 and the fifth portion of the beam, from the non-polarizing beam splitter 830. In some embodiments, the first portion of light and the fifth portion of the beam may cease traveling on the imaging path 860.

In some embodiments, the second portion of the light may travel on the imaging path 860, from the non-polarizing beam splitter 830, to the polarizing beam splitter 814. The non-polarizing beam splitter 830 may then split the second portion of light from the monochromatic source 832 into a third portion of light and a fourth portion of light. In some embodiments, the first beam blocker 820 may be exposed to the third portion of light. The third portion of light may then cease travelling on the imaging path 860. In some embodiments, the long WD objective lens 816 may be exposed to the fourth portion of light, which propagates to the sample 818. The sample 818 may then have a reflected fourth portion of light, which coexists with the fourth portion of light but propagates in the opposite direction. The reflected fourth portion of light may then be split by the polarizing beam splitter 814 adding to the fifth and sixth portions of light. The fifth portion of light may propagate toward the laser 802. The sixth portion of light may propagate toward the non-polarizing beam splitter 830 and split again into a seventh portion of light and an eighth portion of light. The seventh portion of light may propagate toward the monochromatic source 832.

In some embodiments, the eighth portion of light and the sixth portion of the beam may travel on the imaging path 860, from the non-polarizing beam splitter 830, to the tube lens 836. The tube lens 836 may have a 200 mm focal length and assist in imaging. In some embodiments, traveling from the tube lens 836, the eighth portion of light and the sixth portion of the beam may travel to the camera 838. The camera 838 may record the interaction of the beam (and/or portions of the beam) on the sample 818, thereby assisting with the alignment of the beam with the imaged feature to be annealed on the sample 818 (such as a Josephson junction).

In some embodiments, portions of the beam and/or portions of the monochromatic light may travel to their respectively described components concurrently with other portions of the beam and/or other portions of the monochromatic light (e.g., the first portion of the beam may travel to the first beam blocker 820 at the same time the second portion of the beam travels to the long WD objective lens 816).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for forming a qubit, the method comprising:
   forming a Josephson junction between two capacitive plates, wherein the Josephson junction is an aluminum/aluminum-oxide/aluminum trilayer Josephson junction on a substrate; and
   annealing the Josephson junction with a thermal source, wherein the thermal source is a laser that generates a beam, the beam having a diameter that is greater than a diameter of the Josephson junction, wherein the diameter of the beam encompasses one or more portions of each of the two capacitive plates, and wherein annealing the Josephson junction alters the frequency of the qubit.

2. The method of claim 1, wherein the substrate is a Silicon substrate.

3. The method of claim 1, wherein the substrate is a sapphire substrate.

4. The method of claim 1, wherein the substrate is a magnesium oxide substrate.

5. The method of claim 1, wherein each aluminum layer of the aluminum/aluminum-oxide/aluminum trilayer is connected to a respective niobium capacitive plate.

6. The method of claim 1, wherein the beam has a 532 nm wavelength.

7. The method of claim 6, wherein the beam is a Gaussian beam.

8. The method of claim 7, wherein the beam is directed toward the Josephson junction.

9. The method of claim 8, wherein the beam directly illuminates the Josephson junction.

10. The method of claim 9, wherein the beam heats the substrate.

11. The method of claim 10, wherein the beam heats the aluminum portions of the aluminum/aluminum-oxide/aluminum trilayer Josephson junction.

12. The method of claim 11, wherein the beam further heats the aluminum-oxide portion of the aluminum/aluminum-oxide/aluminum trilayer Josphson junction.

13. The method of claim 6, wherein annealing the Josephson junction with the thermal source includes the beam uniformly increasing the temperature of the Josephson junction.

14. The method of claim 13, wherein uniformly increasing the temperature of the Josephson junction comprises applying the thermal source to the Josephson junction as a function of time and a power level of the thermal source, wherein the function of time and the power level of the thermal source are based on the wavelength of the beam and a chosen frequency alteration of the qubit, and wherein the thermal source is automatically shut-off based on the function of time and the power level.

15. The method of claim 14, wherein automatically shutting-off the thermal source based on the function of time and the power level comprises:
   splitting, using a polarizing beam splitter, the beam into a first half directed in a first beam path and a second half directed in a second beam path, wherein the first beam path directs the first half towards the Josephson junction, and wherein the second beam path directs the second half towards a beam intensity meter; and
   identifying, from the beam intensity meter, the power level of the thermal source.

16. The method of claim 13, wherein annealing the Josephson junction to alter the frequency of the qubit increases the frequency of the qubit when the thermal source is at a high-power setting, wherein the high-power setting includes the thermal source being above 1.4 watts for a selected amount of time.

17. The method of claim 13, wherein annealing the Josephson junction to alter the frequency of the qubit decreases the frequency of the qubit when the thermal source is at a low-power setting, wherein the low-power setting includes the thermal source being below 1.4 watts for a selected amount of time.

* * * * *